US010483376B1

(12) United States Patent
Masuoka et al.

(10) Patent No.: US 10,483,376 B1
(45) Date of Patent: Nov. 19, 2019

(54) METHOD FOR PRODUCING A SEMICONDUCTOR DEVICE (71) Applicant: Unisantis Electronics Singapore Pte. Ltd., Singapore (SG)

(72) Inventors: Fujio Masuoka, Tokyo (JP); Hiroki Nakamura, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/520,892

(22) Filed: Jul. 24, 2019

Related U.S. Application Data (60) Division of application No. 15/849,026, filed on Dec. 20, 2017, which is a continuation of application No. PCT/JP2015/081495, filed on Nov. 9, 2015.

(51) Int. Cl.
*H01L 29/66* (2006.01)
*H01L 29/78* (2006.01)
(Continued)

(52) U.S. Cl.
CPC .. *H01L 29/66742* (2013.01); *H01L 21/02636* (2013.01); *H01L 21/28026* (2013.01);
(Continued)

(58) Field of Classification Search
USPC .......................................................... 257/329
See application file for complete search history.

(56) References Cited

U.S. PATENT DOCUMENTS 5,599,724 A * 2/1997 Yoshida ............ H01L 29/66416
438/192
5,994,735 A * 11/1999 Maeda ................. H01L 27/092
257/302
(Continued)

FOREIGN PATENT DOCUMENTS

JP 02-71566 A 3/1990
JP 02-188966 A 7/1990
(Continued)

OTHER PUBLICATIONS

International Search Report, and English language translation thereof, in corresponding International Application No. PCT/JP2015/081495, dated Dec. 15, 2015, 5 pages.
(Continued)

Primary Examiner — Nilufa Rahim
(74) Attorney, Agent, or Firm — Brinks Gilson & Lione (57) ABSTRACT A method for producing a semiconductor device includes depositing a first insulating film and a second insulating film on a planar semiconductor layer formed on a substrate; forming a first hole for forming a gate electrode in the second insulating film; filling the first hole with a first metal to form the gate electrode; forming a side wall formed of a third insulating film on an upper surface of the gate electrode and a side surface of the first hole; performing etching through, as a mask, the side wall formed of the third insulating film, to form a second hole in the gate electrode and the first insulating film; forming a gate insulating film on a side surface of the second hole; and epitaxially growing a semiconductor layer, within the second hole, on the planar semiconductor layer to form a first pillar-shaped semiconductor layer.

1 Claim, 11 Drawing Sheets (51) Int. Cl.
*H01L 21/3213* (2006.01)
*H01L 29/423* (2006.01)
*H01L 29/786* (2006.01)
*H01L 21/02* (2006.01)
*H01L 21/8234* (2006.01)
*H01L 21/28* (2006.01)
*H01L 29/06* (2006.01)

(52) U.S. Cl.
CPC .. *H01L 21/32133* (2013.01); *H01L 21/32139* (2013.01); *H01L 21/823487* (2013.01); *H01L 29/42392* (2013.01); *H01L 29/66666* (2013.01); *H01L 29/7827* (2013.01); *H01L 29/78642* (2013.01); *H01L 29/78696* (2013.01); *H01L 29/0676* (2013.01)

(56) References Cited

U.S. PATENT DOCUMENTS

| | | |
|---|---|---|
| 2008/0068876 A1 | 3/2008 | Sandhu et al. |
| 2009/0101969 A1* | 4/2009 | Katsumata .......... H01L 29/0847 257/329 |
| 2010/0078698 A1 | 4/2010 | Son et al. |
| 2010/0207201 A1 | 8/2010 | Masuoka et al. |
| 2012/0088343 A1* | 4/2012 | Son .................. B82Y 10/00 438/239 |

FOREIGN PATENT DOCUMENTS

| | | |
|---|---|---|
| JP | 03-145761 A | 6/1991 |
| JP | 2009-182318 A | 8/2009 |
| JP | 2015-188115 A | 10/2015 |
| WO | WO 2013/175557 A1 | 11/2013 |

OTHER PUBLICATIONS

WIPO, International Preliminary Report on Patentability for Application No. PCT/JP2015/081495 dated May 24, 2018, pp. 1-7.

* cited by examiner

FIG. 11B

METHOD FOR PRODUCING A SEMICONDUCTOR DEVICE

RELATED APPLICATIONS

The present application is a divisional patent application of U.S. application Ser. No. 15/849,026, filed Dec. 20, 2017, which is a continuation of International Application PCT/JP2015/081495, with an international filing date of Nov. 9, 2015, the entire contents of which are incorporated herein by reference.

BACKGROUND OF THE INVENTION

1. Field of the Invention

The present invention relates to a semiconductor device.

2. Description of the Related Art

Semiconductor integrated circuits, in particular, integrated circuits including MOS transistors, have been produced with a continuous increase in the degree of integration. With this increase in the degree of integration, MOS transistors used in such integrated circuits have come to be produced with reduced dimensions on the order of nanometers. With such a reduction in the dimensions of MOS transistors, the leakage current is difficult to suppress; since a required amount of current needs to be ensured, a reduction in the area of circuits is difficult to achieve, which has been problematic. In order to address such a problem, a Surrounding Gate Transistor (SGT) has been proposed, which has a structure in which the source, the gate, and the drain are disposed in a direction perpendicular to the substrate, and the gate surrounds a pillar-shaped semiconductor layer (for example, Japanese Unexamined Patent Application Publication Nos. 2-71556, 2-188966, and 3-145761).

Forming a gate electrode after formation of the pillar-shaped semiconductor layer has been proposed (for example, Japanese Unexamined Patent Application Publication No. 2015-188115). However, when the pillar-shaped semiconductor layer is narrow, whether or not the pillar-shaped semiconductor layer can be formed so as to stand upright is not known.

SUMMARY OF THE INVENTION

Accordingly, it is an object of the present invention to provide a method for producing a semiconductor device in which a pillar-shaped semiconductor layer is formed after the gate electrode is formed, and the resultant semiconductor device.

A method for producing a semiconductor device according to an embodiment of the present invention includes depositing a first insulating film and a second insulating film on a planar semiconductor layer formed on a substrate; forming a first hole for forming a gate electrode in the second insulating film; filling the first hole with a first metal to form the gate electrode; forming a side wall formed of a third insulating film on an upper surface of the gate electrode and a side surface of the first hole; performing etching through, as a mask, the side wall formed of the third insulating film, to form a second hole in the gate electrode and the first insulating film; forming a gate insulating film on a side surface of the second hole; and epitaxially growing a semiconductor layer, within the second hole, on the planar semiconductor layer to form a first pillar-shaped semiconductor layer.

A semiconductor device according to an embodiment of the present invention includes a planar semiconductor layer formed on a substrate; a first pillar-shaped semiconductor layer formed on the planar semiconductor layer; a gate insulating film surrounding the first pillar-shaped semiconductor layer; a gate electrode surrounding the gate insulating film; and a first insulating film disposed between the gate electrode and the planar semiconductor layer so as to surround the gate insulating film.

The present invention can provide a method for producing a semiconductor device in which a pillar-shaped semiconductor layer is formed after the gate electrode is formed, and the resultant semiconductor device.

A method for producing a semiconductor device according to an embodiment includes depositing a first insulating film and a second insulating film on a planar semiconductor layer formed on a substrate; forming a first hole for forming a gate electrode in the second insulating film; filling the first hole with a first metal to form the gate electrode; forming a side wall formed of a third insulating film on an upper surface of the gate electrode and a side surface of the first hole; performing etching through, as a mask, the side wall formed of the third insulating film, to form a second hole in the gate electrode and the first insulating film; forming a gate insulating film on a side surface of the second hole; and epitaxially growing a semiconductor layer, within the second hole, on the planar semiconductor layer to form a first pillar-shaped semiconductor layer. In this way, after the gate electrode is formed, the pillar-shaped semiconductor layer can be formed.

In addition, before the first pillar-shaped semiconductor layer is epitaxially grown, the gate electrode formed of metal is covered by the first insulating film, the third insulating film, and the gate insulating film. As a result, metal contamination in the first pillar-shaped semiconductor layer can be suppressed.

In the structure including the first insulating film disposed between the gate electrode and the planar semiconductor layer so as to surround the gate insulating film, the first insulating film disposed under the gate electrode surrounds the gate insulating film. This structure ensures insulation between, at the lower end of the gate electrode, the gate electrode and the first pillar-shaped semiconductor layer.

DETAILED DESCRIPTION OF THE PREFERRED EMBODIMENTS

Hereinafter, a method for producing a semiconductor device according to an embodiment of the present invention will be described with reference to FIG. 1A to FIG. 11B. The semiconductor layer according to this embodiment is preferably a silicon layer. The semiconductor layer may be formed of another group IV semiconductor such as Ge or C. Alternatively, the semiconductor layer may be formed of a III-IV compound semiconductor.

Figure 1A:
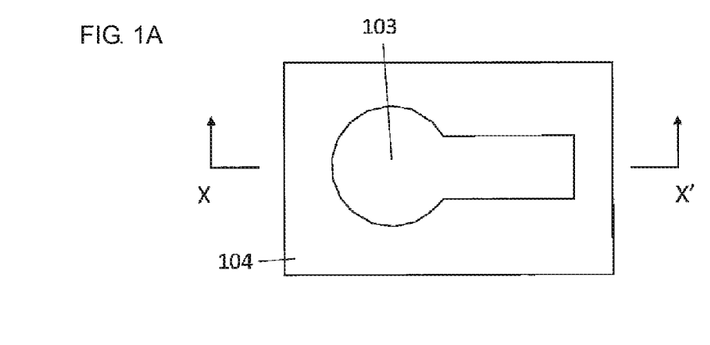
FIG. 1A is a plan view relating to a method for producing a semiconductor device according to an embodiment of the present invention.
Figure 1B:
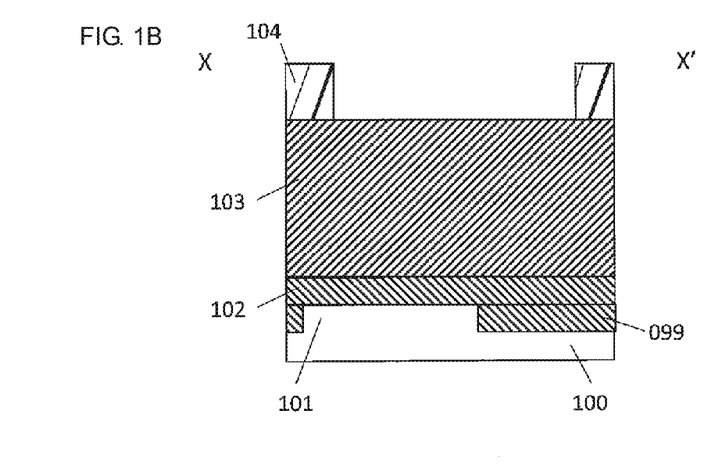
FIG. 1B is a sectional view taken along plane X-X' in FIG. 1A.

As illustrated in FIGS. 1A and 1B, on a planar semiconductor layer 101 formed on a substrate 100, a first insulating film 102 and a second insulating film 103 are deposited; and, on the second insulating film 103, a resist 104 for forming a first hole for forming a gate electrode is formed. At this time, the resist 104 may be formed so as to have a first hole pattern for forming a gate electrode and a gate wiring. When the first hole pattern for forming a gate electrode and a gate wiring is formed, the width of the gate wiring is preferably set to twice or less the width of a side wall of a third insulating film described later. The diameter of the gate electrode is preferably set to twice or more the width of the side wall of the third insulating film described later. The first insulating film 102 is preferably a nitride film. The first insulating film may be formed as an oxide film. The second insulating film is preferably an oxide film. A diffusion layer may be formed in the upper portion of the planar semiconductor layer 101. An isolation insulating film 099 may be formed so as to surround the planar semiconductor layer 101.

Figure 2A:
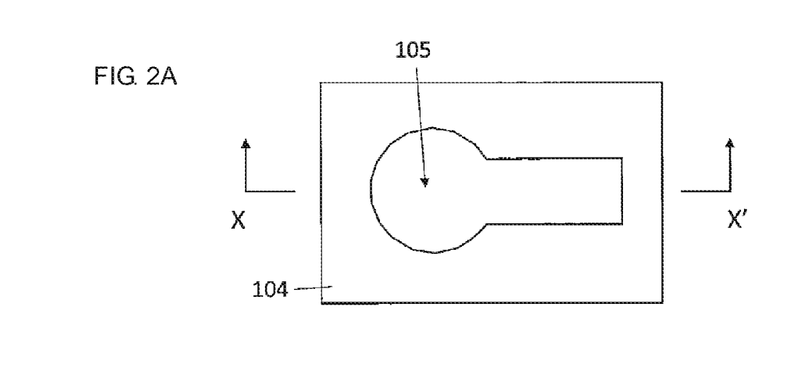
FIG. 2A is a plan view relating to a method for producing a semiconductor device according to an embodiment of the present invention.
Figure 2B:
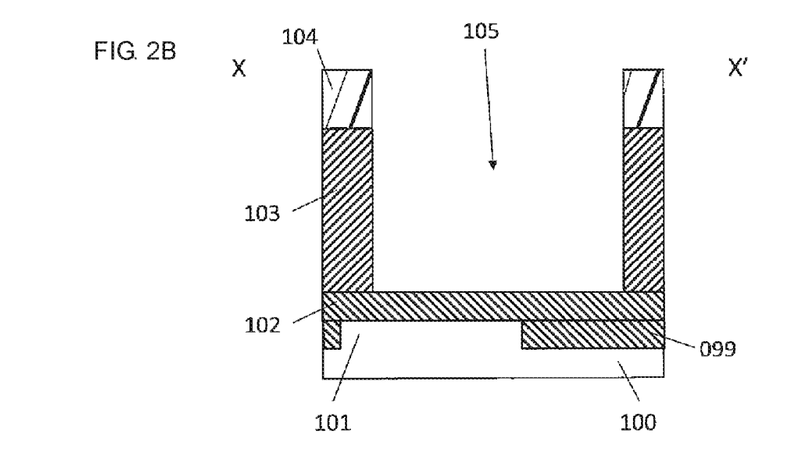
FIG. 2B is a sectional view taken along plane X-X' in FIG. 2A.

As illustrated in FIGS. 2A and 2B, in the second insulating film 103, a first hole 105 for forming the gate electrode is formed.

Figure 3A:
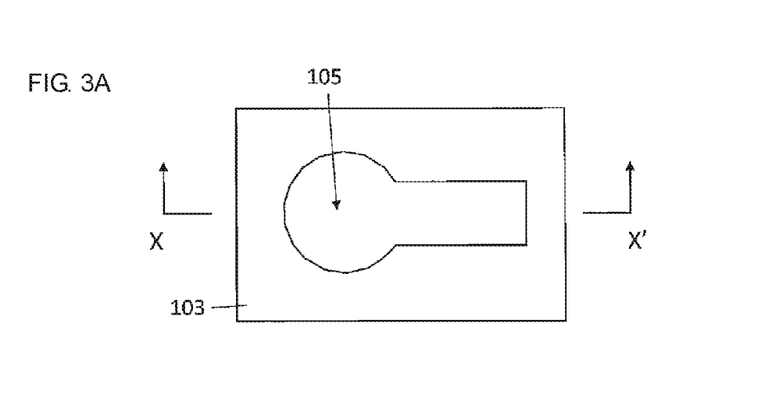
FIG. 3A is a plan view relating to a method for producing a semiconductor device according to an embodiment of the present invention.
Figure 3B:
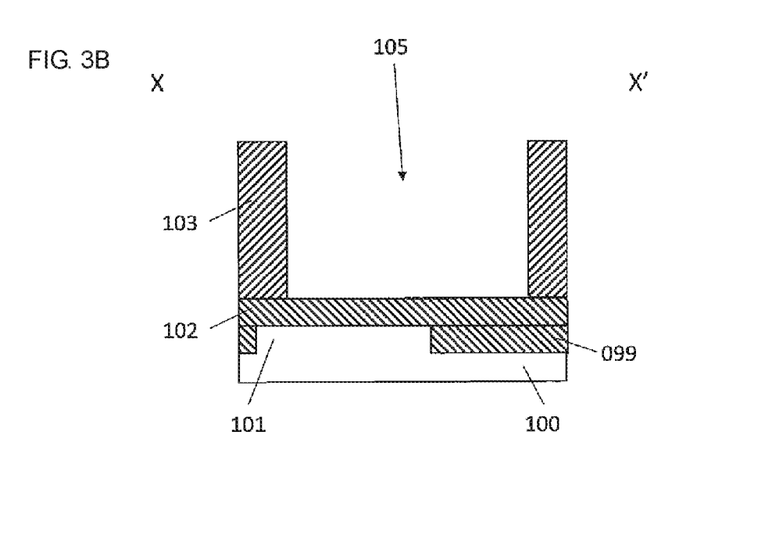
FIG. 3B is a sectional view taken along plane X-X' in FIG. 3A.

As illustrated in FIGS. 3A and 3B, the resist 104 is removed.

Figure 4A:
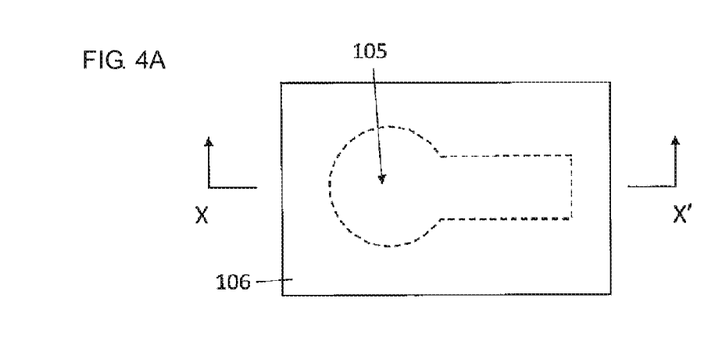
FIG. 4A is a plan view relating to a method for producing a semiconductor device according to an embodiment of the present invention.
Figure 4B:
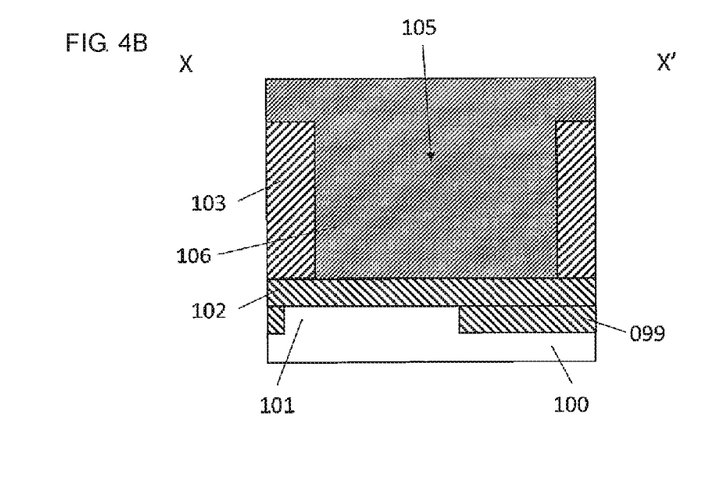
FIG. 4B is a sectional view taken along plane X-X' in FIG. 4A.

As illustrated in FIGS. 4A and 4B, a first metal 106 is deposited in the first hole 105. The first metal 106 is preferably a metal used for semiconductor gates. The first metal 106 is preferably titanium nitride or aluminum titanium nitride.

Figure 5A:
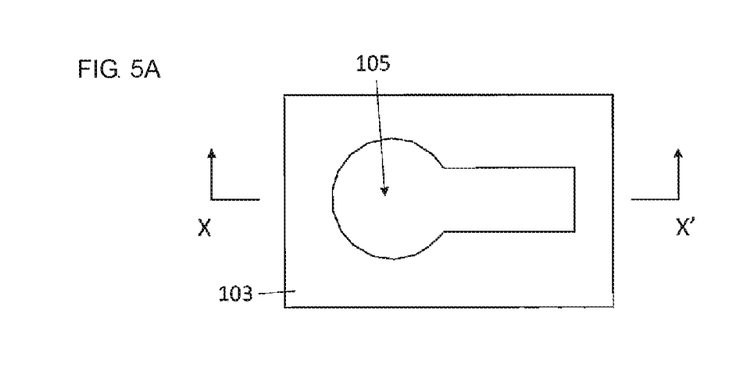
FIG. 5A is a plan view relating to a method for producing a semiconductor device according to an embodiment of the present invention.
Figure 5B:
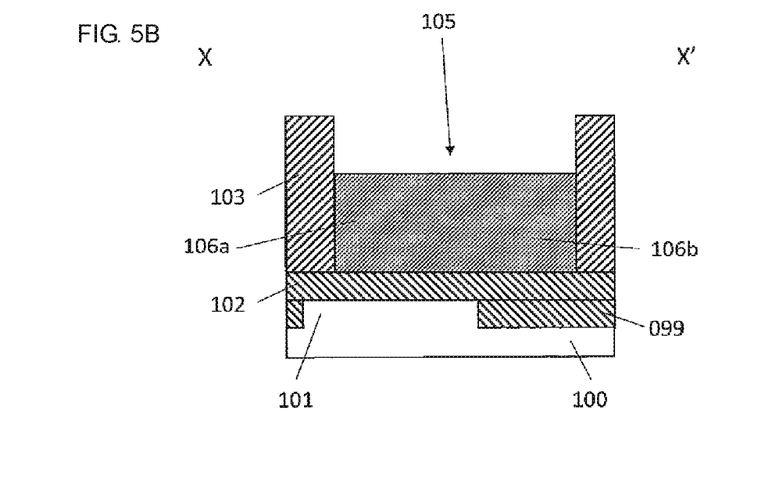
FIG. 5B is a sectional view taken along plane X-X' in FIG. 5A.

As illustrated in FIGS. 5A and 5B, the first metal 106 is subjected to etch back, so that the first metal 106 is disposed within the first hole 105 and a gate electrode 106a is formed. At the same time, a gate wiring 106b may be formed.

Figure 6A:
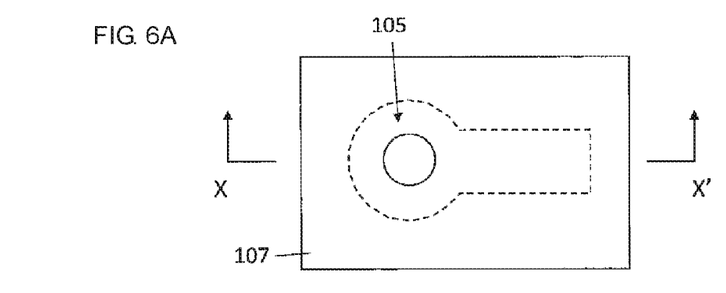
FIG. 6A is a plan view relating to a method for producing a semiconductor device according to an embodiment of the present invention.
Figure 6B:
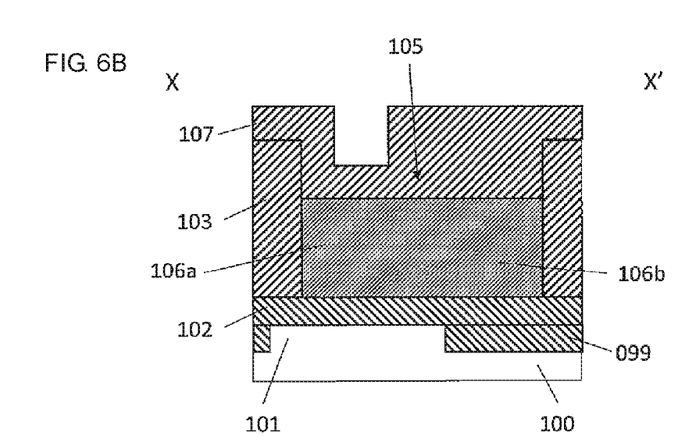
FIG. 6B is a sectional view taken along plane X-X' in FIG. 6A.

As illustrated in FIGS. 6A and 6B, a third insulating film 107 is deposited on the upper surface of the gate electrode 106a and the side surface of the first hole 105.

Figure 7A:
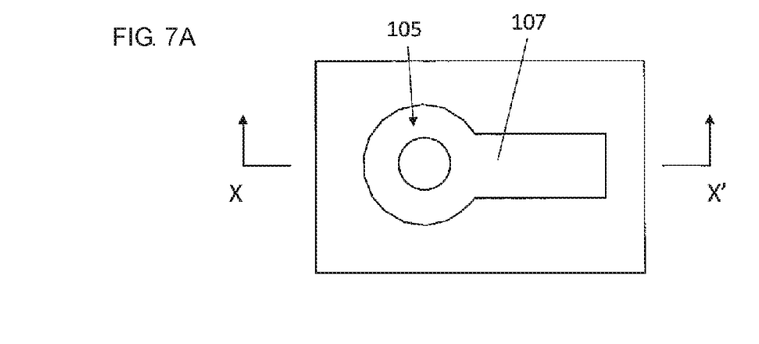
FIG. 7A is a plan view relating to a method for producing a semiconductor device according to an embodiment of the present invention.
Figure 7B:
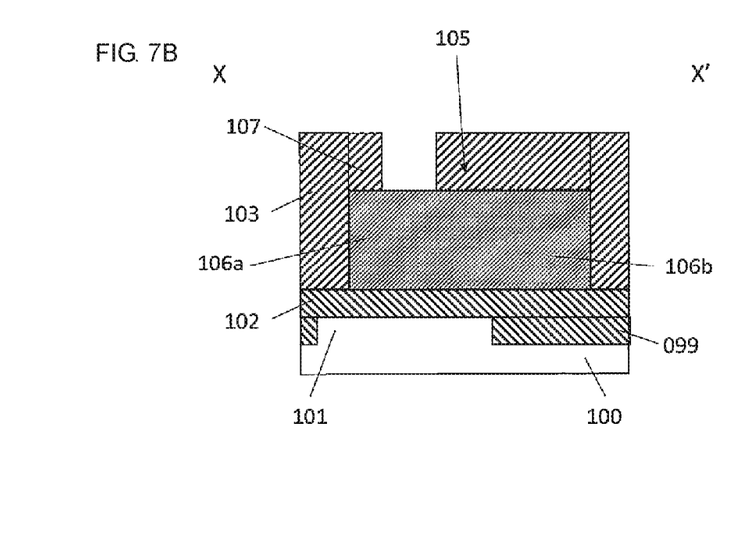
FIG. 7B is a sectional view taken along plane X-X' in FIG. 7A.

As illustrated in FIGS. 7A and 7B, the third insulating film 107 is etched so as to be left in a side-wall shape. Thus, a side wall formed of the third insulating film 107 is formed on the upper surface of the gate electrode 106a and the side surface of the first hole 105.

Figure 8A:
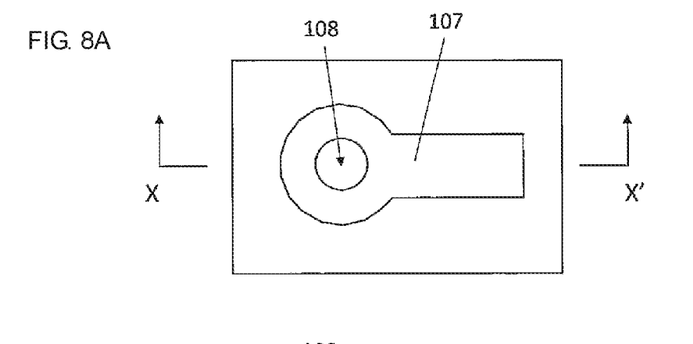
FIG. 8A is a plan view relating to a method for producing a semiconductor device according to an embodiment of the present invention.
Figure 8B:
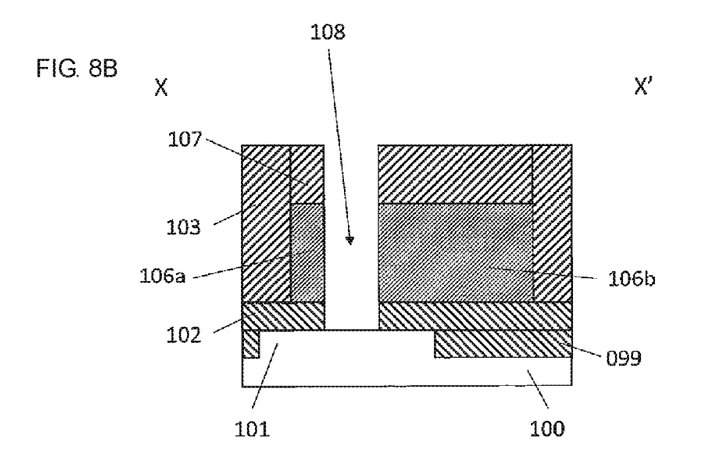
FIG. 8B is a sectional view taken along plane X-X' in FIG. 8A.

As illustrated in FIGS. 8A and 8B, etching is performed through, as a mask, the side wall formed of the third insulating film 107 to form a second hole 108 in the gate electrode 106a and the first insulating film 102.

Figure 9A:
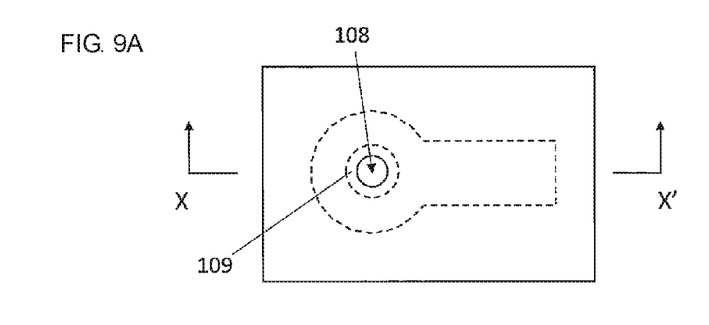
FIG. 9A is a plan view relating to a method for producing a semiconductor device according to an embodiment of the present invention.
Figure 9B:
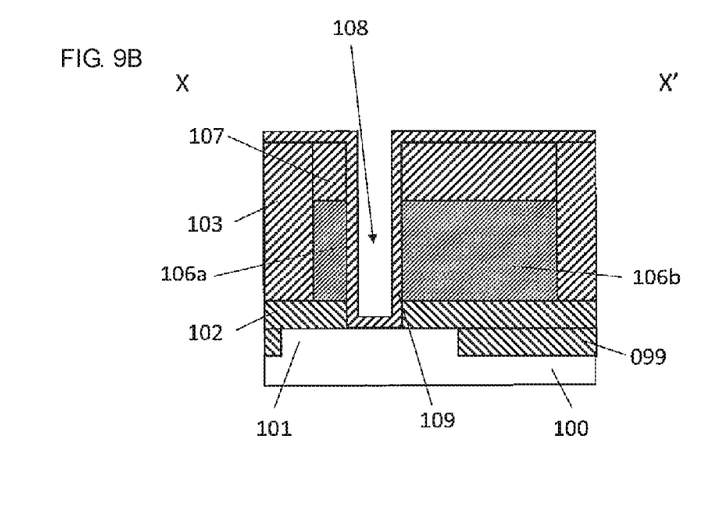
FIG. 9B is a sectional view taken along plane X-X' in FIG. 9A.

As illustrated in FIGS. 9A and 9B, a gate insulating film 109 is deposited. The gate insulating film is preferably a high-dielectric-constant film. The gate insulating film preferably includes any one of an oxide film, a nitride film, and a high-dielectric-constant film.

Figure 10A:
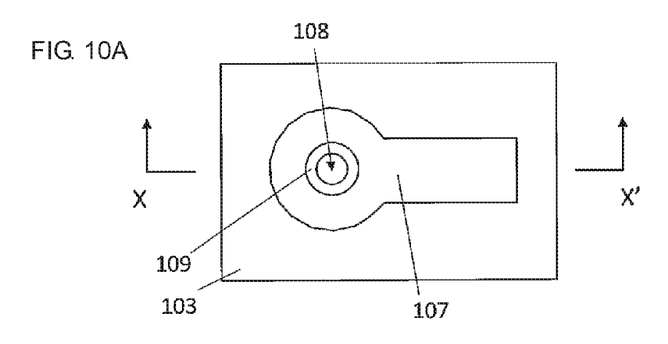
FIG. 10A is a plan view relating to a method for producing a semiconductor device according to an embodiment of the present invention.
Figure 10B:
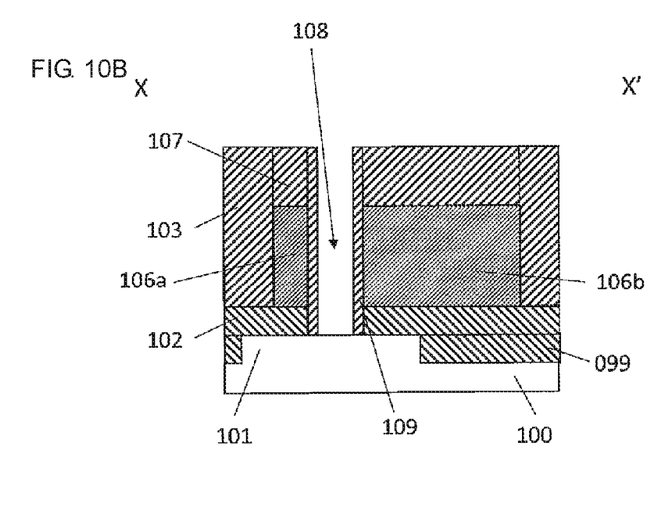
FIG. 10B is a sectional view taken along plane X-X' in FIG. 10A.

As illustrated in FIGS. 10A and 10B, the gate insulating film 109 is etched to form a gate insulating film 109 on the side surface of the second hole 108. Before epitaxial growth of the first pillar-shaped semiconductor layer, the gate electrode 106a and the gate wiring 106b formed of the first metal 106 are covered by the first insulating film 102, the third insulating film 107, and the gate insulating film 109. As a result, metal contamination in the first pillar-shaped semiconductor layer can be suppressed.

Figure 11A:
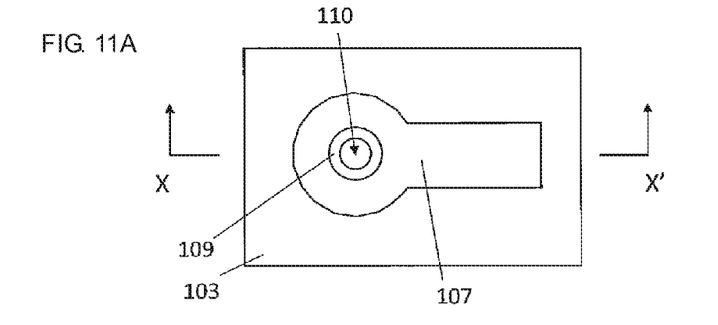
FIG. 11A is a plan view of a semiconductor device according to an embodiment of the present invention.
Figure 11B:
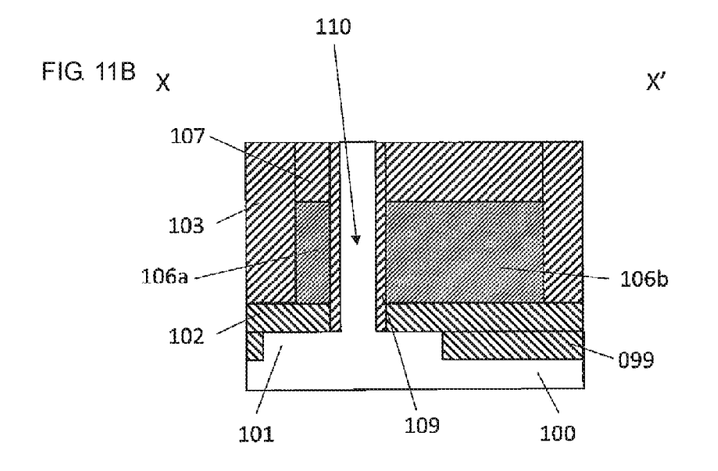
FIG. 11B is a sectional view taken along plane X-X' in FIG. 11A.

As illustrated in FIGS. 11A and 11B, a semiconductor layer is epitaxially grown, within the second hole 108, on the planar semiconductor layer 101 to form a first pillar-shaped semiconductor layer 110. In this way, after the gate electrode is formed, the pillar-shaped semiconductor layer can be formed. Subsequently, a diffusion layer may be formed in the upper portion of the first pillar-shaped semiconductor layer.

The structure of a semiconductor device according to an embodiment of the present invention is illustrated in FIGS. 11A and 11B.

The semiconductor device includes a planar semiconductor layer 101 formed on a substrate 100; a first pillar-shaped semiconductor layer 110 formed on the planar semiconductor layer 101; a gate insulating film 109 surrounding the first pillar-shaped semiconductor layer 110; a gate electrode 106a surrounding the gate insulating film 109; and a first insulating film 102 disposed between the gate electrode 106a and the planar semiconductor layer 101 so as to surround the gate insulating film 109.

In the structure in which the first insulating film 102 is disposed between the gate electrode 106a and the planar semiconductor layer 101 so as to surround the gate insulating film 109, the first insulating film 102 disposed under the gate electrode 106a surrounds the gate insulating film 109. This structure ensures insulation between, at the lower end of the gate electrode 106a, the gate electrode 106a and the first pillar-shaped semiconductor layer 110.

The gate wiring 106b may be connected to the gate electrode 106a. An isolation insulating film 099 may be formed so as to surround the planar semiconductor layer 101.

Incidentally, the present invention encompasses various embodiments and modifications without departing from the broad spirit and scope of the present invention. The embodiments provided above are described for illustration of examples of the present invention, and do not limit the scope of the present invention.

For example, in the above-described example, the p-type (including a pt-type) and the n-type (including an n+-type) in the semiconductor device may be changed to the opposite conductivity types, and the resultant semiconductor device obviously falls within the technical scope of the present invention.

What is claimed is:

1. A method for producing a semiconductor device, the method comprising:
   depositing a first insulating film and a second insulating film on a planar semiconductor layer formed on a substrate;
   forming a first hole for forming a gate electrode in the second insulating film;
   filling the first hole with a first metal to form the gate electrode;
   forming a side wall formed of a third insulating film on an upper surface of the gate electrode and a side surface of the first hole;
   performing etching through, as a mask, the side wall formed of the third insulating film, to form a second hole in the gate electrode and the first insulating film;
   forming a gate insulating film on a side surface of the second hole; and
   epitaxially growing a semiconductor layer, within the second hole, on the planar semiconductor layer to form a first pillar-shaped semiconductor layer.

* * * * *

UNITED STATES PATENT AND TRADEMARK OFFICE
CERTIFICATE OF CORRECTION

PATENT NO. : 10,483,376 B1  
APPLICATION NO. : 16/520892  
DATED : November 19, 2019  
INVENTOR(S) : Fujio Masuoka et al.

Page 1 of 1

It is certified that error appears in the above-identified patent and that said Letters Patent is hereby corrected as shown below:

On the Title Page

Please add:
--(65) Prior Publication Data
US 2019/0348526 A1 November 14, 2019--

In (60) Related U.S. Application Data, insert after "Dec. 20, 2017,":
--now Pat. No. 10,453,941,--

Signed and Sealed this
Twenty-fifth Day of February, 2020

Andrei Iancu
*Director of the United States Patent and Trademark Office*